United States Patent [19]
Chou et al.

[11] Patent Number: 6,104,614
[45] Date of Patent: Aug. 15, 2000

[54] FASTENING DEVICE FOR TIGHT ATTACHMENT BETWEEN TWO PLATES

[75] Inventors: Min-Chan John Chou, Saratoga, Calif.; Chin-Fa Huang, Mar-Kong, Taiwan

[73] Assignee: Hon Hai Precision Ind. Co., Ltd., Taipei Hsien, Taiwan

[21] Appl. No.: 09/287,938

[22] Filed: Apr. 7, 1999

Related U.S. Application Data

[60] Provisional application No. 60/081,245, Apr. 9, 1998.

[51] Int. Cl.$^7$ ........................................ H05K 7/20
[52] U.S. Cl. .................... 361/704; 361/697; 361/709; 361/710; 361/735; 361/742; 174/16.3; 165/80.3; 165/185; 257/714; 257/719
[58] Field of Search ........................ 361/704–712, 361/717–722, 735, 742, 697; 257/706–726; 174/16.3, 138 G, 252; 165/80.3, 80.4, 125, 185, 299, 124; 415/177; 24/458; 267/150, 160, 158

[56] References Cited

U.S. PATENT DOCUMENTS 5,943,210  8/1999  Lee et al. .................. 361/697

Primary Examiner—Leo P. Picard
Assistant Examiner—Michael Datskovsky
Attorney, Agent, or Firm—Wei Te Chung

[57] ABSTRACT

A fastening device (10) includes a locking pin (12) and an associated pressing clip (14). The locking pin (12) includes a flat head (16) with ring-like shallow (18) therein for easy operational installation of the fastening device (12) unto the heat sink (100) and the PC board (200). A leg section (20) is provided below the head (16), including four locking legs (22) separated from one another by the slots (24) therebetween and extending downward from the head (16). Each leg (22) defines an enlarged tapered section (26) at the distal end with a shoulder section (28) thereabouts for latchable engagement with the back surface (201) of the PC board (200) around the corresponding hole (202) through which the locking pin (12) extends. A ring-like recess (30) is provided on the middle portions of the legs (22) for lowering the insertion force or preventing unnecessary excessive friction during insertion of the locking pin (12) into the corresponding holes (102, 202) of the heat sink (100) and of the PC board (200). A clip resting section (18) is positioned adjacent and under the head (16) with a step (38) therebetween for allowing the base (40) of the clip (14) to be mounted thereunto. Two wings or piers (44) of the clip (14) are provided by two ends of the base (40) of the clip (14).

8 Claims, 5 Drawing Sheets

FASTENING DEVICE FOR TIGHT ATTACHMENT BETWEEN TWO PLATES

This application claims a Priority Filing Date of Apr. 9, 1998 benefited by a previously filed Provisional Application 60/081,245 by the same inventors as the present Patent Application.

BACKGROUND OF THE INVENTION

1. Field of The Invention

The invention relates to fastening devices for combining two plate-like pieces together, and particularly to the fastening device for tightly attaching a heat sink to a CUP mounted on a daughter board.

2. The Related Art

Traditionally, a CPU in the computer is installed unto a PGA (Pin Grid Array) socket which is mounted on a mother board, and a heat sink is attached to the CPU by a clip which is generally hooked unto the side edges of either the CPU or the socket, for example, U.S. Pat. Nos. 5,381,305 and 5,436,798. Recently, the PGA sockets were replaced by the so-called the slot 1 connector with the associated retention means whereby a daughter board module with the CPU thereon is retained thereto wherein the heat sink is tightly fastened, by four screws, to the case or enclosure of the daughter board module for removal of heat generated by the CPU in the daughter board module.

To lower down the cost of the daughter board module, an attempt is made to remove the enclosure of the daughter board module. Thus, it is required to have the a clip directly hooked unto the daughter board instead of the enclosure. One approach is taken that a plate-like clip with four hook legs on the four corners presses the back surface of the daughter board thus having the CPU on the front surface thereof abut against the heat sink wherein the four hook legs extend through the holes of the daughter board and are respectively latched to holes of the heat sink. Anyhow, it is not easy to make such plate like clip, and moreover, it requires to use a specific tool for simultaneously having the four hook legs latchably extend into the corresponding holes in the daughter board and in the heat sink. Further more, an excess tolerance of the positions or of the dimensions of the clip may prohibit clip from being expectedly evenly located, thus resulting in insufficient and bad combination between the heat sink and the CPU that substantially affects the heat transfer efficiency of the CPU and the corresponding signal transmission. Additionally, the main body of the plate directly presses against the back surface of the daughter board, and thus may damage the circuits thereabouts.

Accordingly, it is known that another design is provided to use a locking pin with an associated surrounding coil spring wherein the distal end of the coil spring presses the bottom plate of the heat sink against the top surface of the CPU and the bottom end of the locking pin abuts against the back surface of the daughter board around the corresponding hole thereof through which the locking pin extends. Anyhow, the coil spring may provide, under some severe vibration situation, an unstable and unbalanced pressure on the heat sink that may jeopardize the securement between the heat sink and the daughter board, thus decreasing the heat transfer efficiency.

Accordingly, an object of the invention is to provide a fastening device including a locking pin and an associated pier-like clip, thus reliably pressing the heat sink against the CPU on the daughter board.

SUMMARY OF THE INVENTION

According to an aspect of the invention, a fastening device includes a locking pin and an associated pressing clip. The locking pin includes a flat head with ring-like shallow therein for easy operational installation of the fastening device unto the heat sink and the daughter board. A leg section is provided below the head, including four locking legs separated from one another by the slots thereamong and extending downward from the head. Each leg defines an enlarged tapered section at the distal end with a shoulder section thereabouts for latchable engagement with the back surface of the daughter board around the corresponding hole through which the locking pin extends. A ring-like recess is provided on the middle portions of the legs for lowering the insertion force or preventing unnecessary excessive friction during insertion of the locking pin into the corresponding holes of the heat sink and of the daughter board wherein the diameter of the upper section and the lower section of the leg section are generally compliant with the holes of the heat sink and the daughter board. A clip resting section is positioned adjacent and under the head with a step therebetween for allowing the base of the clip to be mounted thereunto. Two wings or piers of the clip are provided by two ends of the base of the clip. When the fastening device is used with the heat sink and the daughter board, the locking pin is inserted into the corresponding holes of the heat sink and of the daughter board whereby the shoulder of the locking pin abuts against the back surface of the daughter board around the corresponding hole by mean that the heat sink is pressed against toward the CPU and the daughter board below by the spring forces generated by the deflected wings of the clip.

DETAILED DESCRIPTION OF THE PREFERRED EMBODIMENTS

Figure 1:
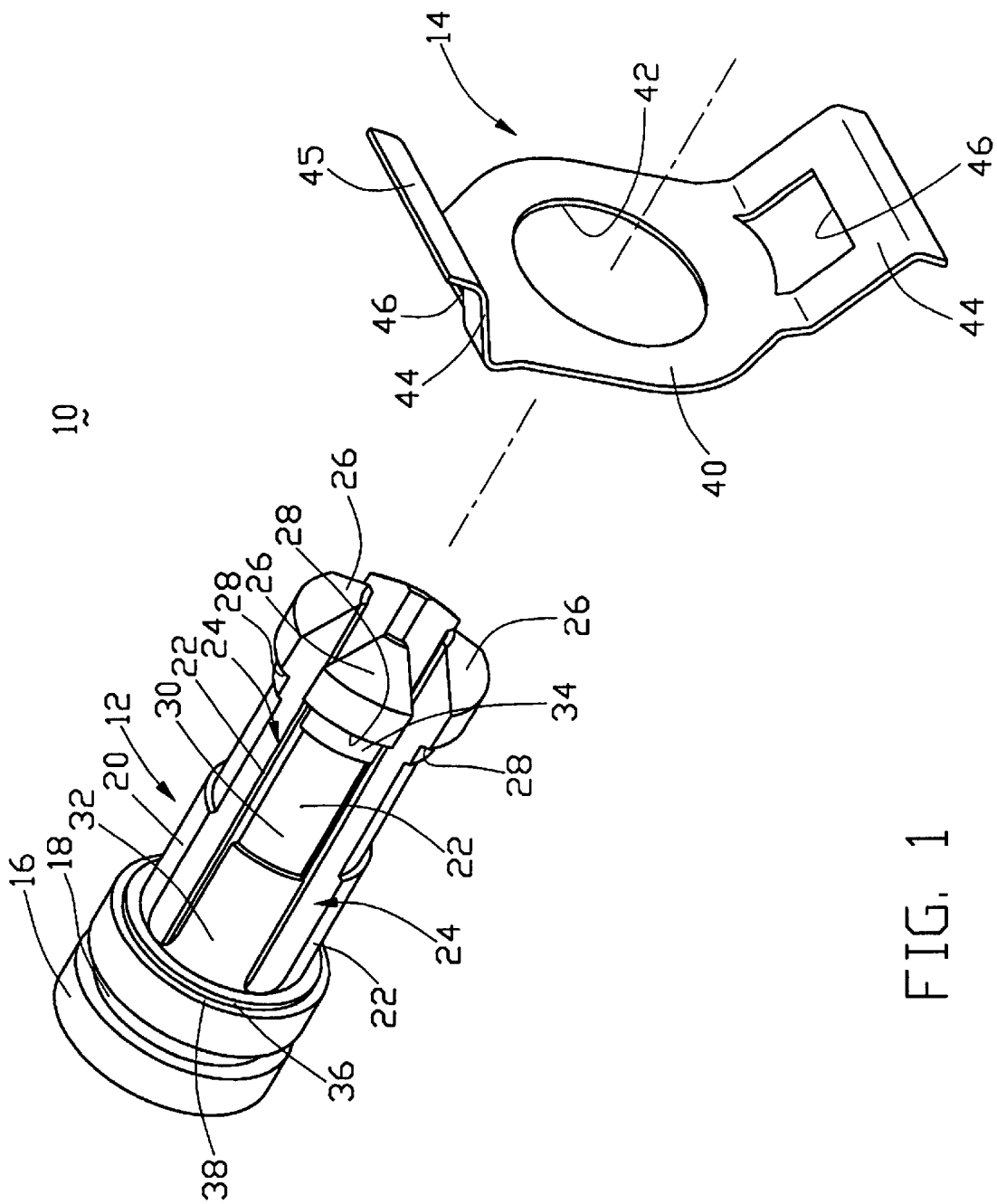
FIG. 1 is an exploded perspective view of an presently preferred embodiment of a fastening device for use with the heat sink and the CPU on a daughter board, according to the invention.
Figure 2:
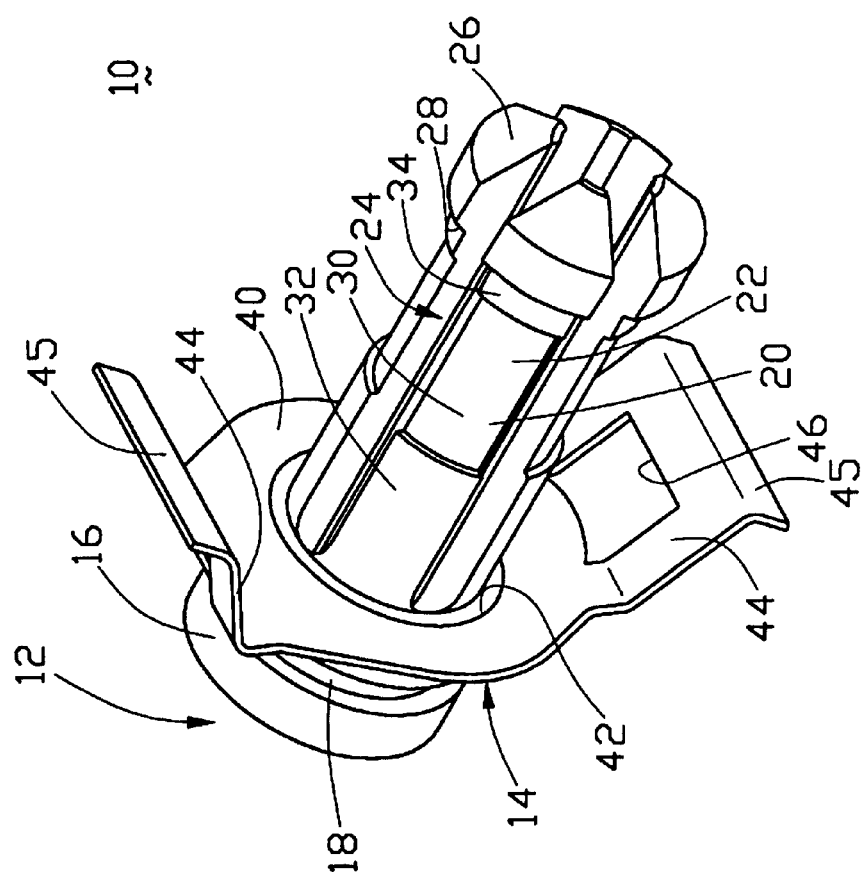
FIG. 2 is a perspective view of the assembled fastening device of FIG. 1.
Figure 3:
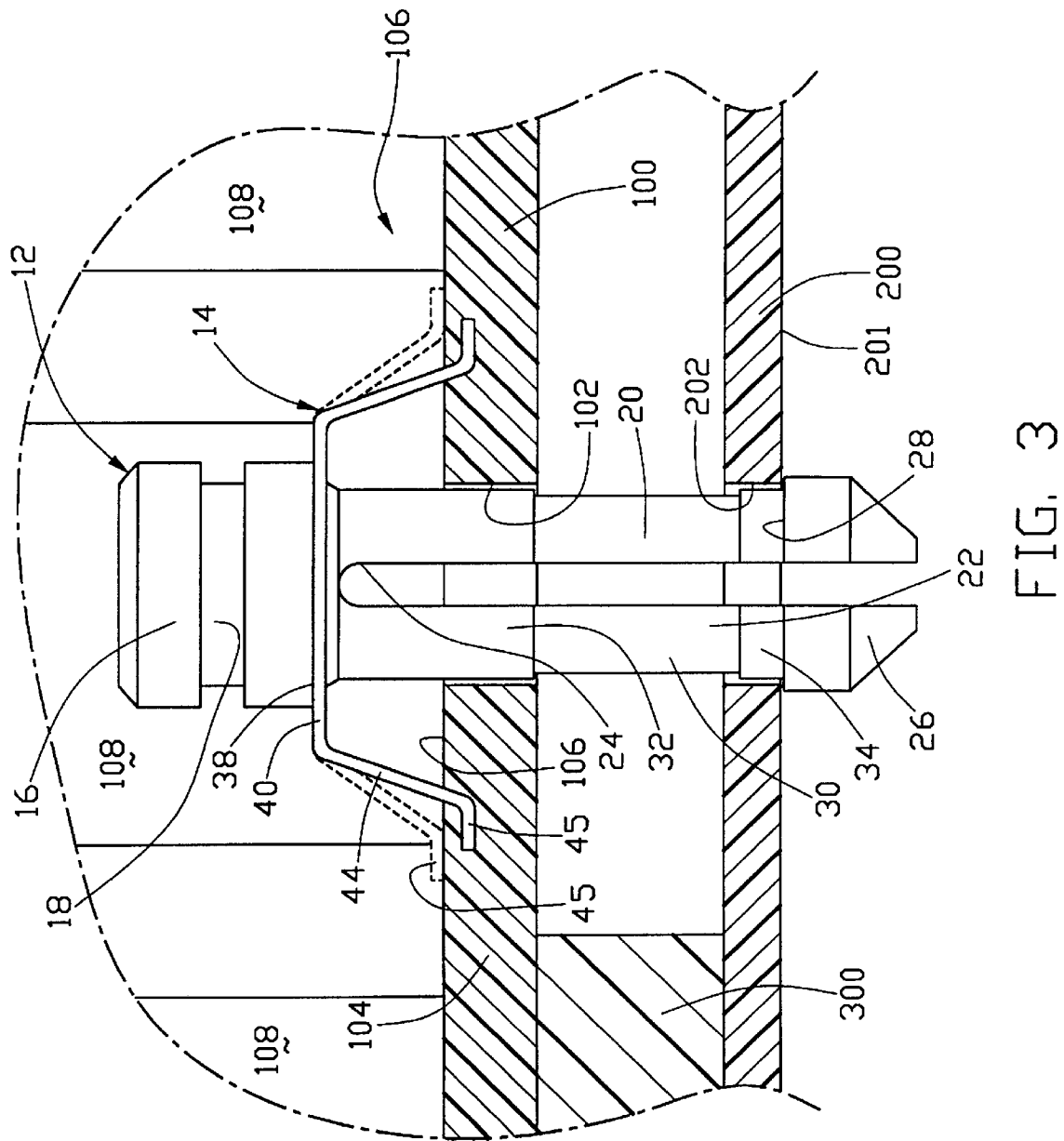
FIG. 3 is a partial cross-sectional view of the fastening device of FIG. 1 and the corresponding heat sink and daughter board with the CPU thereon.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 1–5 wherein a fastening device 10 includes a locking pin 12 made by lathing and an associated pier-like clip 14 mad by stamping.

The pin 12 includes a flat head 16 with a ring-like shallows 18 therein for allowing for using some tool to load the fastening device 10 to the heat sink 100 and the daughter board 200.

A leg section 20 is integrally provided below the head 16, consisting of four legs 22 separated from one another by four axial slots 24. Each leg 22 includes an tapered expansion section 26 forming an upward facing shoulder 28 for engagement with a back surface 201 of the daughter board 200 around a corresponding hole 202 through which the pin 12 extends. It can be noted that the tapered configuration of the expansion section 26 eases insertion of the locking pin 12 into the corresponding hole 102 of the heat sink 100 and hole 202 of the daughter board 200.

A ring-like recess 30 is disposed around the leg section 20 to provide more resiliency and space thereof and prevent improper friction damage on either the heat sink 100 or the daughter board 200 during insertion of the locking pin 12 into the corresponding hole 102 in the heat sink 100 and hole 202 in the daughter board 200.

It can be noted that due to ring-like recess 30, an upper section 32 and a lower section 34 are formed on two opposite ends of the recess 30 along the pin 12 wherein the diameter of the upper section 32 and that of the lower section 34 generally comply with the holes 102 of the heat sink 100 and the hole 202 of the daughter board 200.

A clip resting section 36 intermediates between the head 16 and the leg section 20, and forms a step 38 under the head 16 whereby a plane base 40 of the clip 14 with a retention aperture 42 therein can be seated unto the step 38 wherein the aperture 42 of the clip 14 receivably engages the resting section 36 in an tight interference fit. A pair of wings or piers 44 obliquely extend outward and downward from two opposite ends of the base 40 each with an opening 46 therein for increasing resiliency thereof and with a distal end 45 for abutment against a top surface 106 of the heat sink 100.

Therefore, when used, the locking pin 12 extends through the corresponding hole 102 of the heat sink 100 and hole 202 of the daughter board 200 wherein the expansion sections 26 of the legs 22 engage the back surface 201 of the daughter board 200 around the corresponding holes 202, due to the reaction forces and the initial spring force which is generated from the wings 44 of the clip 14 and presses the base plate 104 of the heat sink 100 against the CPU 300 mounted on the daughter board 200. Thus, the heat sink 100 and the daughter board 200 can be tightly and stackably combined as one assembly.

Figure 4:
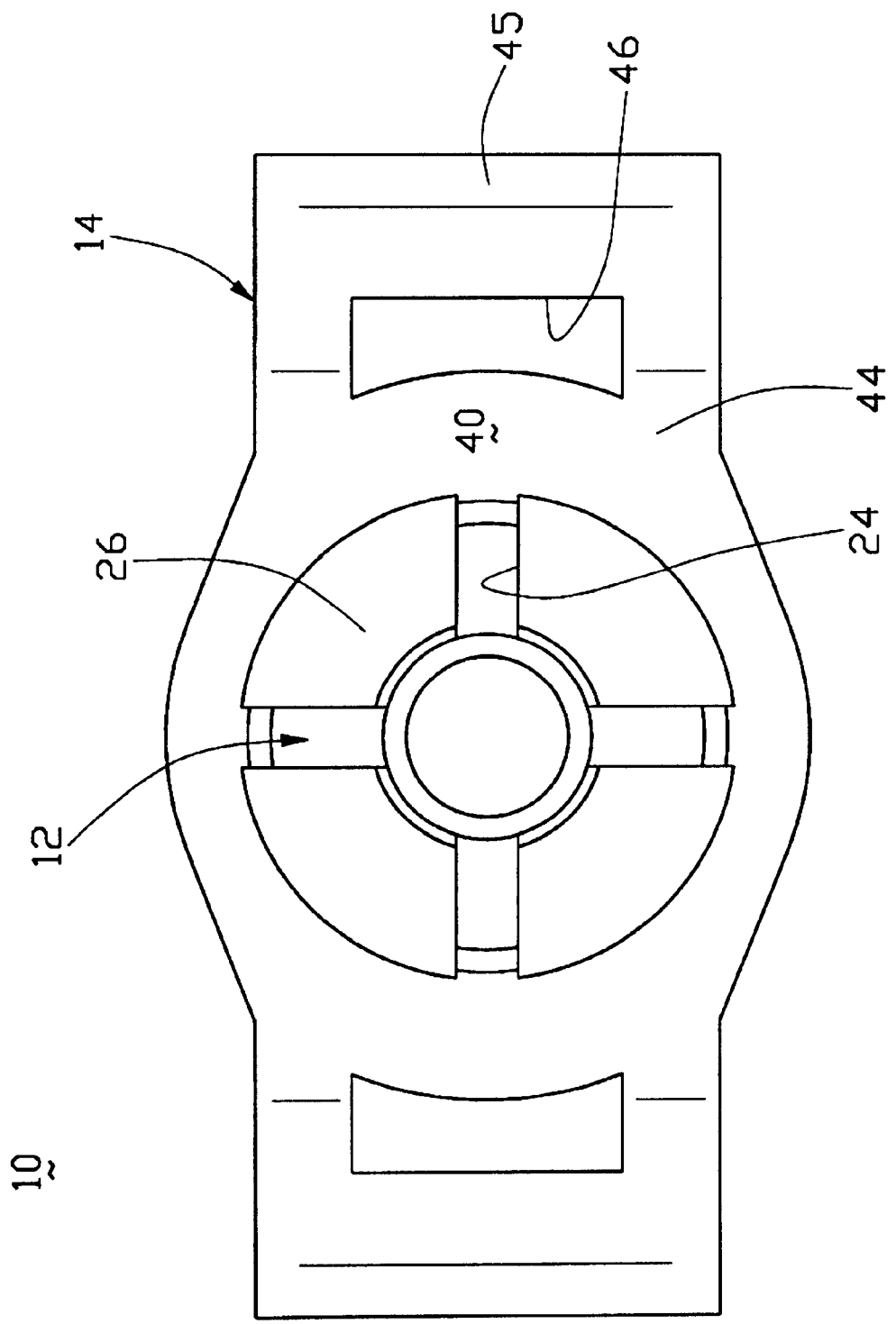
FIG. 4 is a bottom view of the fastening device of FIG. 1.

Referring to FIG. 4, the four slots 24 defining a cross-like configuration from a bottom view, provides adjustment in both the X and Y axes on a horizontal plane for efficiently forgiving any improper excess tolerance and mis-centered arrangement between the locking pins 12 and the corresponding holes 102, 202 or the heat sink 100 and the daughter board 200, thus assuring proper and reliably tight attachment between the heat sink 100 and the CPU 300 on the daughter board 200.

Figure 5:
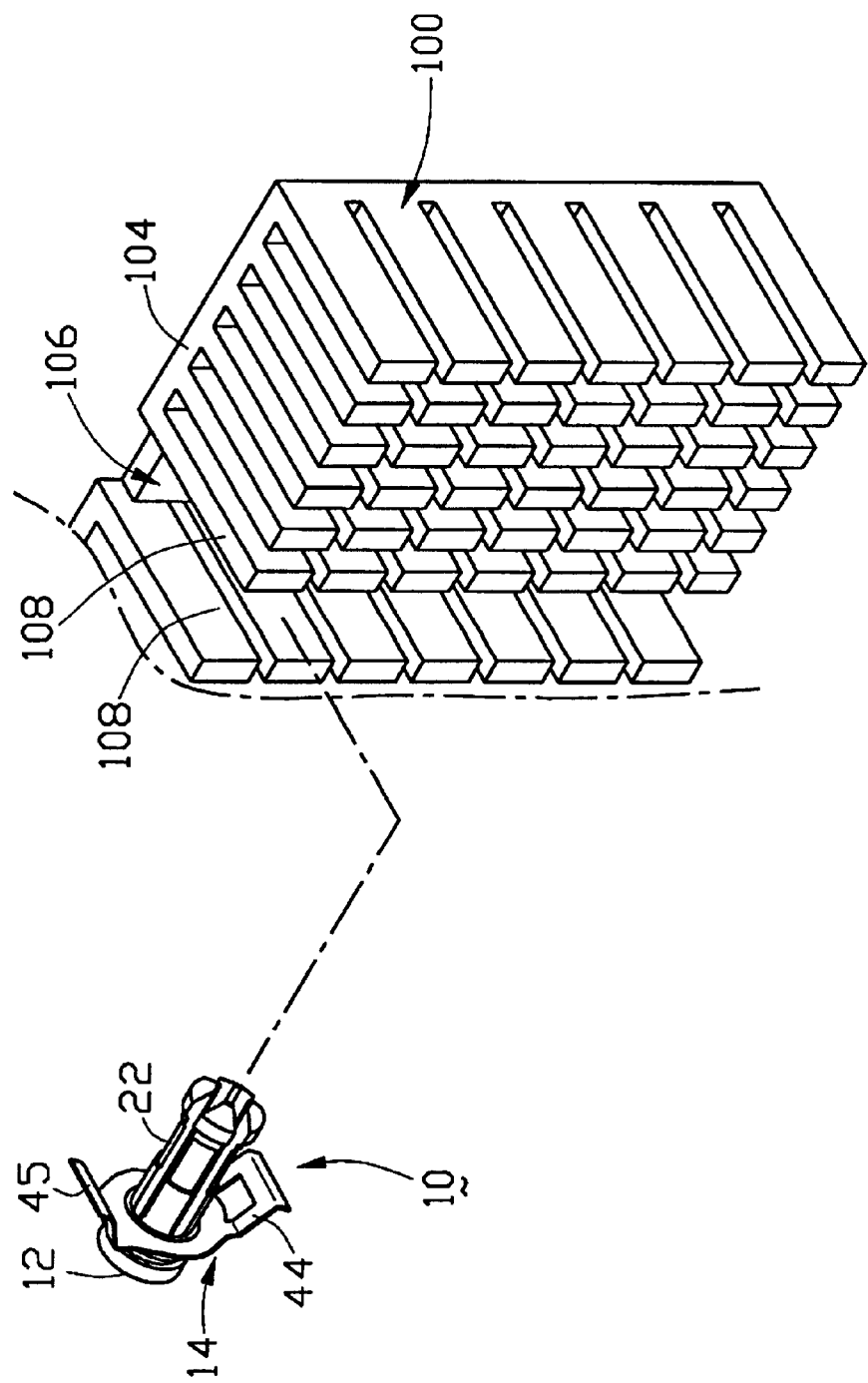
FIG. 5 is a partial exploded perspective view of the heat sink and the corresponding fastening device to show orientation therebetween.

Referring to FIG. 5, the pair of wings 44 not only provides balanced and sufficiently strong spring forces against the heat sink 100 for obtaining the desired heat transfer efficiency between the heat sink and the CPU, but also is adapted to be compliantly received within a groove-like passageway 106, formed between the fins 108, of the heat sink 100, thus allowing for using the existing heat sink without additional reshaping of the heat sink.

It is also noted that according to the invention, the sum of the thicknesses of the base plate 104 of the heat sink 100, the CPU and the daughter board 200, should be larger than the vertical distance between the end 45 of the wing 44 and the shoulder 28, and thus the wings 44 of the clip 14 may be upwardly deflected or deformed to provide the spring force against the heat sink 100 for firmly retaining the base plate 104 of the heat sink 100, the daughter board 200 and the associated CPU 300 between the wings 44 and the shoulder 28.

We claim:

1. A fastening device for attaching a heat sink to a CPU mounted on a PC board, including:

a locking pin having a head on a top portion, a leg section on a bottom portion, and a clip resting section therebetween;

a clip including a base retained unto the clip resting section of the locking pin, and a pair of wings at two opposite ends of the base.

2. The fastening device as defined in claim 1, wherein the leg section includes four legs separated from one another by four axial slots spaced from one another at equal intervals around a cross-sectional circumference of the locking pin, which can efficiently forgiving an improper excess tolerance of the legs along either axis X or axis Y on a horizontal plane.

3. The fastening device as defined in claim 1, wherein the a ring-like recess is provided on the locking pin whereby an upper section and a lower section are formed at two opposite ends of the ring-like recess, wherein diameters of the upper section and the lower section are generally compliant with those of corresponding holes in the heat sink and the PC board while a diameter of the recess is substantially smaller than that of the upper section or the lower section so as to not only provide more resiliency thereof but also prevent improper friction damage of the heat sink or of the PC board during insertion of the locking pin into the corresponding holes of the heat sink and the PC board.

4. An arrangement for assembling a heat sink to a PC board having a CPU thereon, comprising:

a fastening device including a locking pin and an associated clip;

said locking pin defining a leg section including more than one legs each with an upward shoulder for being adapted to be engaged with a back surface of the PC board;

the clip including a base firmly secured to the locking pin and above the leg section, a pair of wings extending outward and downward from two opposite ends of the base wherein the said pair of wings are exactly compliant with and positioned within a groove in the heat sink whereby the locking pin between said pair of wings substantially extends through a corresponding first hole in a base plate of the heat sink under said groove, and another corresponding second hole in the PC board until the shoulder of the leg engages the back surface of the PC board whereby the wings of the clip provide a sufficient spring force against the base plate of the heat sink for pressing the heat sink against the CPU on the PC board.

5. The arrangement as defined in claim 4, wherein a vertical distance between a distal end of each of said pair of wings and the shoulder is substantially smaller than a sum of thicknesses of the base plate of the heat sink, the CPU and the PC board so as to generate a sufficient spring force thereof for firmly sandwiching the heat sink and the PC board therebetween.

6. The arrangement as defined in claim 4, wherein a ring-like recess is provided on the locking pin with an upper section and a lower section formed adjacent two opposite ends thereof wherein a diameter of the upper section is essentially equal to that of the first hole in the heat sink, another diameter of the lower section is essentially equal to that of the second hole in the PC board, and a third diameter of the ring-like recess is substantially smaller than either the first diameter or the second diameter.

7. A fastening device for combining a heat sink and a PC board with a CPU thereon, comprising:

- a locking pin defining an upward shoulder and a downward step; and
- a clip including a base and a pair of wings extending downward and outward from two opposite ends thereof; wherein
- said upward shoulder and said downward step respectively engage with a bottom surface of the PC board and the base of the clip when the fastening device cooperatively combines the heat sink and the PC board, whereby the wings are deflected to generate a corresponding spring force for firmly pressing the heat sink against the CPU.

8. A fastening device for securing an upper first piece and a lower second piece together wherein each of said first and second piece includes a plate-like portion with through holes therein, said fastening comprising:

- a locking pin including a leg section, on a lower portion, defining an upward facing shoulder;
- a clip disposed adjacent an upper portion of the locking pin, including a pair of wings extending downward toward said upward facing shoulder; wherein
- a vertical distance between an distal end of each of the wings and the shoulder is substantially smaller than a total thickness of an assembly of the stacked first and second pieces whereby,
- when assembled, the locking pin with the associated clip inserted into the corresponding aligned holes of the first piece and second piece, the shoulder of the leg section of the locking pin abuts against a bottom surface of the second piece and the end of the wing of the clip upwardly deflectably abuts against a top surface of the first piece for firmly combining the first piece and the second piece together.

* * * * *